United States Patent
Bengoechea De La Llera

(10) Patent No.: US 12,339,306 B2
(45) Date of Patent: Jun. 24, 2025

(54) METHOD FOR LOCATING A FAULT POINT ON A HIGH-VOLTAGE THREE-PHASE AC CABLE, AND SYSTEM FOR LOCATING A FAULT POINT

(71) Applicant: LUMIKER APLICACIONES TECNOLOGICAS S.L., Derio (ES)

(72) Inventor: Francisco Javier Bengoechea De La Llera, Derio (ES)

(73) Assignee: LUMIKER APLICACIONES TECNOLOGICAS S.L., Derio (ES)

( * ) Notice: Subject to any disclaimer, the term of this patent is extended or adjusted under 35 U.S.C. 154(b) by 202 days.

(21) Appl. No.: 18/129,342

(22) Filed: Mar. 31, 2023

(65) Prior Publication Data
US 2023/0324449 A1   Oct. 12, 2023

(30) Foreign Application Priority Data
Apr. 6, 2022   (EP) .................................... 22382331

(51) Int. Cl.
*G01R 31/08*   (2020.01)
(52) U.S. Cl.
CPC .................................. *G01R 31/083* (2013.01)
(58) Field of Classification Search
CPC ........................ G01R 31/083; G01R 19/2513; G01R 31/088; G01R 31/52
(Continued)

(56) References Cited

U.S. PATENT DOCUMENTS

2015/0212139 A1* 7/2015 Smith .................... G01R 31/52
                                                          324/509
2016/0061873 A1* 3/2016 Liu ...................... G01R 31/088
                                                          702/59
(Continued)

FOREIGN PATENT DOCUMENTS

CN        109116189 A        1/2019

OTHER PUBLICATIONS

European Search Report, EP22372331, Sep. 16, 2022, 6 pages.
(Continued)

*Primary Examiner* — Giovanni Astacio-Oquendo
(74) *Attorney, Agent, or Firm* — Edell, Shapiro & Finnan, LLC

(57) ABSTRACT

Method for locating a fault point (F) on a high-voltage three-phase AC cable with single point connection system. The method includes the following steps: (a) determining the conductor (R, S, T) in fault based on previously measured conductor currents ($I_{R1}$, $I_{S1}$, $I_{T1}$, $I_{R2}$, $I_{S2}$, $I_{T2}$). In the event the cable includes more than one section ($P_1$, $P_2$), determining section ($P_1$, $P_2$) in fault based on previously measured shield currents ($I_{SR1}$, $I_{SS1}$, $I_{ST1}$, $I_{SR2}$, $I_{SS2}$, $I_{ST2}$). The fault point (F) being located by means of a model of section ($P_1$, $P_2$) in fault of the earth continuity conductor (ECC), the only unknown being the distance (x) to the fault point (F) from an end of said section ($P_1$, $P_2$) in fault.

12 Claims, 4 Drawing Sheets

(58) Field of Classification Search
USPC .................................. 324/522, 512, 500
See application file for complete search history.

(56) References Cited

U.S. PATENT DOCUMENTS

| | | |
|---|---|---|
| 2021/0072302 A1 | 3/2021 | Frohne et al. |
| 2021/0247435 A1* | 8/2021 | Haynes .............. G01R 19/2513 |
| 2022/0252656 A1* | 8/2022 | Mathieu ................ G01R 31/088 |
| 2023/0333154 A1* | 10/2023 | Waydick ................ G01R 31/54 |
| 2023/0393186 A1* | 12/2023 | Pomar Pedredo ... G01R 31/088 |

OTHER PUBLICATIONS

He et al., "Diagnosis and Location of High-voltage Cable Fault Based on Sheath Current", 2018 International Conference on Power System Technology (Powercon), IEEE, Nov. 6, 2018, pp. 3353-3359.

Wu et al., "Research on "two-step positioning method" of high voltage cross-bonded cable based on sheath current", 2021 China Automation Congress (CAC), Oct. 22, 2021, pp. 3956-3951.

* cited by examiner

METHOD FOR LOCATING A FAULT POINT ON A HIGH-VOLTAGE THREE-PHASE AC CABLE, AND SYSTEM FOR LOCATING A FAULT POINT

CROSS-REFERENCE TO RELATED APPLICATIONS

This application relates to and claims the benefit and priority to European Application No. EP223822331.1, filed Apr. 6, 2022.

TECHNICAL FIELD

The present invention relates to a method for locating a fault point on a high-voltage three-phase AC cable and to a system for locating a fault point.

BACKGROUND

Methods for detecting a fault on high-voltage three-phase AC cables, i.e., that a short circuit has occurred between a conductor and a shield of said cable, are known.

Methods which, in addition to detecting a fault, locate the point where said fault has occurred, are also known.

For example, U.S. Publication No. 20210072302A1 relates to a method for locating a fault point on a high-voltage cable based on providing at least two current measuring apparatuses arranged at the cable at a given distance and having timers synchronized with one another, and a measuring device for detecting an electric current flowing in the shield and/or an earthing line connecting the shield and earth. The measuring apparatus transmits pairs of current measurement values and associated values of the timer to an analysis unit which, upon the occurrence of a current exceeding a threshold value and/or of a current profile over time that satisfies specific stipulations, feeds to a calculation unit the associated values of the timers and also an indication about the location of the measurement, for which first effects of the short circuit occurred. The calculation unit calculates the location of the fault from the known distance between the measuring apparatuses and a difference between the values of the synchronized timers.

SUMMARY

An object of the invention is to provide a method for locating a fault point on a high-voltage three-phase AC cable, and a system for locating a fault point on a high-voltage three-phase AC cable.

A first aspect of the invention relates to a method for locating a fault point on a high-voltage three-phase AC cable.

The cable in which the method of the invention is applied comprises a first end, a second end, and at least one section extending between said ends, the cable comprising a conductor and a respective shield per phase. The cable comprises a single point connection system, i.e., the shields are connected to a surge arrester device grounded at one end of said at least one section, and the shields are connected to a grounding element at the other end of said at least one section. The cable comprises an earth continuity conductor establishing a common ground connecting the ground connections of the grounding element(s) and the surge arrester device(s).

The method comprises the following steps:
measuring the conductor current circulating through each conductor both at the first end and at the second end of the cable,
measuring the shield current circulating through each shield in each section at a point close to the grounding element,
measuring the earth continuity conductor current circulating through each section at a point close to the grounding element,
determining the conductor in fault based on the previously measured conductor currents,
in the event that the cable comprises more than one section, determining the section in fault based on the previously measured shield currents, and
locating the fault point by means of a model, also referred to as digital twin, of the section in fault of the earth continuity conductor, the only unknown being the distance to the fault point from an end of said section in fault.

A second aspect of the invention relates to a system for locating a fault point on a cable such as the one described in the first aspect of the invention, the system comprising:
a first current measuring equipment configured for measuring the conductor current circulating through each conductor both at the first end and at the second end of the cable,
a second current measuring equipment configured for measuring the shield current of each shield in each section at a point close to the grounding element,
a third current measuring equipment configured for measuring the earth continuity conductor current of the earth continuity conductor in each section at a point close to the grounding element, and
a computer configured for executing the method described in the first aspect of the invention based on the current measurements performed by said current measuring equipment.

The points at which the shields are connected to a surge arrester device are free for the purpose of conductivity, i.e., as if they were in an open circuit, such that it complicates the possibility of using a model of the shields to be able to calculate the fault point, since the voltage is unknown at said points. The voltage would have to be measured at said points to be able to use a model of the shields, and this may generate many problems. This problem is avoided by using the model of the earth continuity conductor since it is a model the ends of which are grounded.

The method for locating and the system for locating of the invention offer a rapid solution for locating a fault point on a high-voltage three-phase AC cable, with the result virtually being obtained in real time.

Even though a model of the earth continuity conductor is required for locating the exact fault point, said model is not very sensitive to the type of the terrain in which the cable is arranged, since it affects the different parameters of the model in a similar manner, and therefore, the influence thereof is virtually cancelled.

Furthermore, the fault resistance, i.e., the resistance between the conductor in fault and the shield in fault at fault point F, does not need to be known to locate the fault point.

These and other advantages and features will become apparent in view of the figures and of the detailed description.

DETAILED DESCRIPTION

Figure 1:
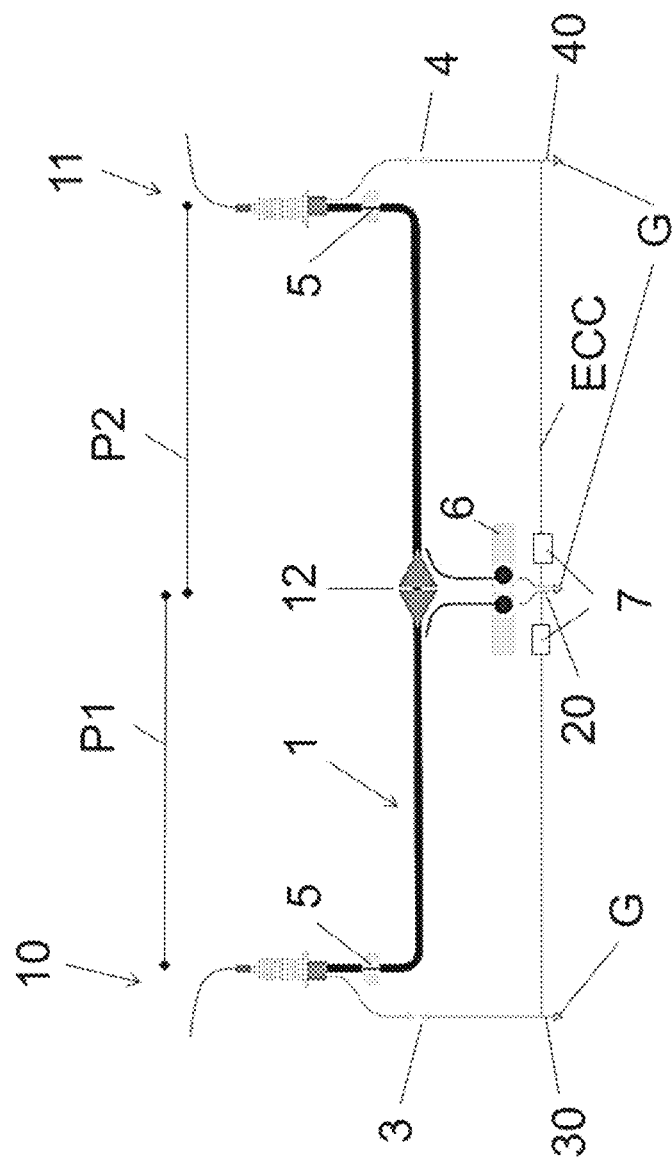
FIG. 1 schematically shows a system for locating a fault point on a cable according to a first embodiment of the invention applied on a cable having a first configuration.

A first aspect of the invention relates to a method for locating a fault point F on a high-voltage three-phase AC cable 1.

The method of the invention is configured for locating a fault point F on a cable 1 extending between a first end 10 and a second end 11, said cable 1 comprising at least one section $P_1$, $P_2$ extending between said ends 10, 11. The cable 1 comprises one conductor R, S, T per phase and a shield $S_R$, $S_S$, $S_T$ associated with each conductor R, S, T.

As discussed above, fault point F is considered the point where one of the conductor R, S, T, of the cable 1 has electrical contact with the corresponding shield $S_R$, $S_S$, $S_T$, such that a short circuit occurs between said conductor R, S, T and the corresponding shield at said fault point F. Furthermore, in the context of the invention, section in fault will be considered section $P_1$, $P_2$ of cable 1 at which the fault point F is arranged.

The method of the invention is configured for being applied on cables 1 with single point connection systems, i.e., on cables 1 in which the shields $S_R$, $S_S$, $S_T$ are connected to a surge arrester device 3, 4 connected to ground G at one end of each section $P_1$, $P_2$, shields $S_R$, $S_S$, $S_T$ being connected to a grounding element at the other end of each section $P_1$, $P_2$. Cables 1 of this type with single point connection systems comprise an earth continuity conductor ECC establishing a common ground G of the system connecting the ground connection(s) 20 of the grounding element(s) and the ground connection(s) 30, 40 of the surge arrester device(s) 3, 4 of the cable 1.

The method of the invention comprises the following steps:

measuring the conductor current $I_{R1}$, $I_{S1}$, $I_{T1}$, $I_{R2}$, $I_{S2}$, $I_{T2}$ circulating through each conductor R, S, T both at the first end 10 and at the second end 11 of the cable 1, measuring the shield current $I_{SR1}$, $I_{SS1}$, $I_{ST1}$, $I_{SR2}$, $I_{SS2}$, $I_{ST2}$ circulating through each shield $S_R$, $S_S$, $S_T$ in each section $P_1$, $P_2$ at a point close to the grounding element 2, measuring the earth continuity conductor current $I_{ECC1}$, $I_{ECC2}$ circulating through each section $P_1$, $P_2$ at a point close to the grounding element 2, determining the conductor R, S, T in fault based on the previously measured conductor currents $I_{R1}$, $I_{S1}$, $I_{T1}$, $I_{R2}$, $I_{S2}$, $I_{T2}$, in the event that the cable 1 comprises more than one section $P_1$, $P_2$, determining section $P_1$, $P_2$ in fault based on the previously measured shield currents $I_{SR1}$, $I_{SS1}$, $I_{ST1}$, $I_{SR2}$, $I_{SS2}$, $I_{ST2}$, and locating the fault point F by means of a model of section $P_1$, $P_2$ in fault of the earth continuity conductor ECC, the only unknown being the distance x to the fault point F from an end of said section $P_1$, $P_2$ in fault.

Preferably, for determining the conductor R, S, T in fault, the conductor current $I_{R1}$; $I_{S1}$; $I_{T1}$ measured at the first end 10 of the cable 1 for each conductor R, S, T is compared with the conductor current $I_{R2}$; $I_{S2}$; $I_{T2}$ measured at the second end 11 of the cable 1, determining that the conductor R, S, T in fault will be the conductor in which the conductor current $I_{R1}$, $I_{R2}$; $I_{S1}$, $I_{S2}$; $I_{T1}$, $I_{T2}$ at said ends 10, 11 is different.

Preferably, for determining section $P_1$, $P_2$ in fault, the shield currents $I_{SR1}$, $I_{SS1}$, $I_{ST1}$; $I_{SR2}$, $I_{SS2}$, $I_{ST2}$ of each section P1, P2 are analysed, determining that section $P_1$, $P_2$ in fault will be the conductor in which one of the shield currents $I_{SR1}$, $I_{SS1}$, $I_{ST1}$; $I_{SR2}$, $I_{SS2}$, $I_{ST2}$ has an overcurrent value. The shield current $I_{SR1}$, $I_{SS1}$, $I_{ST1}$; $I_{SR2}$, $I_{SS2}$, $I_{ST2}$ circulating through the shields $S_R$, $S_S$, $S_T$ when there is no fault is a low-value eddy current, for example a current of up to 10 A. However, when a fault occurs, an overcurrent that is much higher than the eddy current, for example a current higher than 10,000 A, circulates through the corresponding shield $S_R$, $S_S$, $S_T$. Therefore, when a fault occurs, simply looking at the shield currents $I_{SR1}$, $I_{SS1}$, $I_{ST1}$; $I_{SR2}$, $I_{SS2}$, $I_{ST2}$ of each section $P_1$, $P_2$ is sufficient to determine which of the sections $P_1$, $P_2$ is in fault. It should be pointed out that since each section $P_1$, $P_2$ is connected at one of its ends to ground G, the overcurrent circulating through the shield $S_R$, $S_S$, $S_T$ in fault circulates towards ground G such that the rest of the sections $P_1$, $P_2$ are not affected by said fault.

Preferably, the model of the earth continuity conductor ECC of section $P_1$, $P_2$ in fault takes into account the self-resistance $R_{ECC}$ and the self-inductance $L_{ECC}$ of the earth continuity conductor ECC, the ground resistance $R_g$ of the ground connections 20, 30, 40 of the grounding element and the corresponding surge arrester device 3, 4, the mutual inductance $M_R$, $M_S$, $M_T$ between said earth continuity conductor ECC and each of the conductors R, S, T, and the mutual inductance $M_{SR}$, $M_{SS}$, $M_{ST}$ between said earth continuity conductor ECC and the shield in fault $S_R$, $S_S$, $S_T$ from the fault point F to the point where the shields are connected to ground G.

Determining the parameters of the model can be accomplished through the use of an electromagnetic transients simulator (EMT simulator) which estimates parameters based on the features of the cable 1 (i.e., layers, thickness, material, etc.), the arrangement of said cable 1 (i.e., depth, separation, etc.) and the features of the land where it is disposed. For example, the EMT simulator PSCAD™ manufactured by PSCAD can be used. See pscad.com.

When defining the model of the earth continuity conductor ECC, values relevant for the purpose of current have been taken into account, and capacitive inputs have been disregarded since they are of little value in fault situations.

Furthermore, mutual inductance between the shields $S_R$, $S_S$, $S_T$ which are not in fault and earth continuity conductor ECC have been ignored for defining the model since they input scarcely any coupling on the cable ECC and are therefore negligible values, and the same occurs with the shield in fault to fault point F.

Preferably, the location of the fault point is calculated using the following formula:

$$0 = I_{ECCF}(R_g + R_g + R_{ECC} + jwL_{ECC}) - I_{ECCNFL}R_g - I_{ECCNFR}R_g + jwxI_{CNF1}M_{CNF1} + jwxI_{CNF2}M_{CNF2} + jwxI_{CF1}M_{CF} + jw(1-x)I_{CNF1}M_{CNF1} + jw(1-x)I_{CNF2}M_{CNF2} - jw(1-x)I_{CF2}M_{CF} + jw(1-x)I_{SF}M_{SF}$$

wherein, $I_{ECCF}$ = The current circulating through the section that is in fault, $I_{ECCNFL}$ = The current circulating through the section which is not in fault to the left of the section in fault; in the event that there is no section to the left of the section in fault its value will be zero, $I_{ECCNFR}$ = The current circulating through the section which is not in fault to the right of the section in fault;

in the event that there is no section to the right of the section in fault its value will be zero, $R_g$=The ground resistance of the grounding of the shields or of the grounding of the surge arrester device at one of the ends of the section in fault, $R_{ECC}$=The self-resistance of the earth continuity conductor ECC of the section in fault, calculated taking into account the characteristics of the cable 1, $L_{ECC}$=The self-inductance of the earth continuity conductor ECC of the section in fault, calculated taking into account the characteristics of the cable 1, $I_{CNF1}$=Current circulating through a first conductor which is not in fault, both at the first end 10 of the cable 1 and at the second end 11 of the cable 1, $I_{CNF2}$=Current circulating through a second conductor which is not in fault, both at the first end 10 of the cable 1 and at the second end 11 of the cable 1, $I_{CF1}$=Current circulating through the conductor in fault at the first end 10 of the cable 1, $I_{CF2}$=Current circulating through the conductor in fault at the second end 11 of the cable 1, $$I_{CF1} \neq I_{CF2}$$

$I_{SF}$=Current circulating through the shield in fault in the section in fault; if the current flows from the first end to the second end, it will be considered positive; in contrast, if it flows from the second end to the first end, it will be considered negative, $M_{CNF1}$=Mutual inductance between the first conductor which is not in fault and the earth continuity conductor ECC, calculated taking into account the characteristics of the cable 1, $M_{CNF2}$=Mutual inductance between the second conductor which is not in fault and the earth continuity conductor EC, is calculated taking into account the characteristics of the cable 1, $M_{CF}$=Mutual inductance between the conductor which is in fault and the earth continuity conductor ECC, calculated taking into account the characteristics of the cable 1, $M_{SF}$=Mutual inductance between the shield which is in fault and the earth continuity conductor ECC, calculated taking into account the characteristics of the cable 1, and x=The distance to the fault point from the end of section $P_1$ in fault at which the surge arrester device is arranged to the fault point F.

Preferably when the cable 1 comprises more than one section $P_1$, $P_2$, ground resistance $R_g$ is determined by means of a model of the earth continuity conductor ECC of a section $P_1$, $P_2$ which is not in fault, said model comprising the self-resistance $R_{ECC}$ and the self-inductance $L_{ECC}$ of the earth continuity conductor ECC, the ground resistance $R_g$ of the ground connections 20, 30, 40 of the grounding element and the corresponding surge arrester device 3, 4, the mutual inductance $M_R$, $M_S$, $M_T$ between said earth continuity conductor ECC and each of the conductors R, S, T, the only unknown being said ground resistance $R_g$.

Preferably, ground resistance $R_g$ is calculated by means of the following formula:

$$0 = I_{ECCNF}(R_g + R_g + R_{ECC} + jwL_{ECC}) - I_{ECCL}R_g - I_{ECCR}R_g + jwI_{CNF1}M_{CNF1} + jwI_{CNF2}M_{CNF2} + jwI_{CF}M_{CF}$$

wherein, $I_{ECCNF}$=The current circulating through the section which is not in fault the model of which is used to calculate ground resistance $R_g$, $I_{ECCL}$=The current circulating through the section to the left of the section the model of which is used to calculate ground resistance $R_g$; in the event that there is no section to the left its value will be zero, $I_{ECCR}$=The current circulating through the section to the right of the section the model of which is used to calculate ground resistance $R_g$; in the event that there is no section to the right its value will be zero, $R_g$=The ground resistance of the grounding of the shields or of the grounding of the surge arrester device at one of the ends of the section in fault, $R_{ECC}$=The self-resistance of the earth continuity conductor ECC of the section the model of which is used to calculate ground resistance $R_g$, calculated taking into account the characteristics of the cable 1, $L_{ECC}$=The self-inductance of the earth continuity conductor ECC of the section the model of which is used to calculate ground resistance $R_g$, calculated taking into account the characteristics of the cable 1, $I_{CNF1}$=Current circulating through a first conductor which is not in fault, both at the first end 10 of the cable 1 and at the second end 11 of the cable 1, $I_{CNF2}$=Current circulating through a second conductor which is not in fault, both at the first end 10 of the cable 1 and at the second end 11 of the cable 1, $I_{CF}$=Current circulating through the conductor in fault; if the current flows from the first end to the second end, it will be considered positive; in contrast, if it flows from the second end to the first end, it will be considered negative, $M_{CNF1}$=Mutual inductance between the first conductor which is not in fault and the earth continuity conductor ECC, calculated taking into account the characteristics of the cable 1, $M_{CNF2}$=Mutual inductance between the second conductor which is not in fault and the earth continuity conductor ECC, calculated taking into account the characteristics of the cable 1, and $M_{CF}$=Mutual inductance between the conductor which is in fault and the earth continuity conductor ECC, calculated taking into account the characteristics of the cable 1.

Conversely, when the cable 1 comprises a single section $P_1$, preferably the ground resistance $R_g$ of the ground connections 20, 30 of the grounding element and the surge arrester device 3 is estimated, for example, taking into account parameters such as: ground humidity, ground temperature, etc.

A second aspect of the invention relates to a system for locating a fault point F on a high-voltage three-phase AC cable 1.

The system of the invention is configured for locating a fault point F on a cable 1 extending between a first end 10 and a second end 11, comprising said cable 1 at least one section $P_1$, $P_2$ extending between said ends 10, 11. The cable 1 comprises one conductor R, S, T per phase and a shield $S_R$, $S_S$, $S_T$ associated with each conductor R, S, T.

The system of the invention is configured for being applied on cables 1 with single point connection systems, i.e., on cables 1 in which the shields $S_R$, $S_S$, $S_T$ are connected to a surge arrester device 3, 4 connected to ground G at one end of each section $P_1$, $P_2$, being the shields $S_R$, $S_S$, $S_T$ connected to a grounding element at the other end of each section $P_1$, $P_2$. Cables 1 of this type with single point connection systems comprise an earth continuity conductor ECC establishing a common ground G of the system connecting the ground connection(s) 20 of the grounding element(s) and the ground connection(s) 30, 40 of the surge arrester device(s) 3, 4 of the cable 1.

The system of the invention comprises a first current measuring equipment 5 configured for measuring the conductor current $I_{R1}$, $I_{S1}$, $I_{T1}$, $I_{R2}$, $I_{S2}$, $I_{T2}$ circulating through each conductor R, S, T both at the first end 10 and at the second end 11 of the cable 1.

The system of the invention also comprises a second current measuring equipment 6 configured for measuring the shield current $I_{SR1}$, $I_{SS1}$, $I_{ST1}$, $I_{SR2}$, $I_{SS2}$, $I_{ST2}$ of each shield $S_R$, $S_S$, $S_T$ in each section $P_1$, $P_2$ at a point close to the grounding element 2.

Furthermore, the system of the invention also comprises a third current measuring equipment 7 configured for measuring the earth continuity conductor current $I_{ECC1}$, $I_{ECC2}$ of the earth continuity conductor ECC in each section $P_1$, $P_2$ at a point close to the grounding element 2.

The system of the invention comprises a computer configured for executing the method described in the first aspect of the invention based on the current measurements performed by said current measuring equipment 50, 51, 52, 53, 54, 55, 60, 61, 62, 63, 64, 65, 70, 71.

In at least one embodiment, the computer used to implement the method of the invention may include one or more processors, one or more memory elements, storage, a bus, one or more network processing units interconnected with one or more network input/output (I/O) interfaces, one or more I/O interfaces, and a computer program.

The computer program comprises a plurality of instructions which, when executed by the processor, cause the processor to execute the steps of the method of the invention. In at least one embodiment, the processor or processors are at least a hardware processor configured to execute various tasks, operations and/or functions for the computer according to the software and/or the instructions configured for the computer, for example, in the computer program.

In at least one embodiment, the memory element and/or storage are configured to store data, information, software, and/or instructions associated with the computer, and/or the logic configured for the memory element and/or storage. In an embodiment of the computer, the computer program is stored in any combination of memory element(s) and/or storage.

In at least one embodiment, the bus can be configured as an interface that enables one or more elements of the computer to communicate with each other so as to exchange information and/or data. The bus can be implemented with any architecture designed for exchanging control, data, and/or information between processors, memory elements/storage, peripheral devices, and/or any other hardware and/or software component that may be configured for the computer.

In several embodiments, the network processor unit(s) may enable communication between the computer and other systems, entities, etc., through the network I/O interface(s) (wired and/or wireless). In several embodiments, the network processor unit(s) can be configured as a combination of hardware and/or software, as one or more Ethernet drivers and/or controllers or interface cards, fibre channel (e.g., optical) driver(s) and/or controller(s), wireless receivers/transmitters/transceivers, baseband processor(s)/modem(s) and/or other similar network interface driver(s) and/or controller(s) that are known now or may be developed hereinafter so as to enable communications between the computer and other systems, entities, etc., to facilitate the operations for the various embodiments of the method described herein. In several embodiments, the network I/O interface(s) can be configured as one or more Ethernet ports, fibre channel ports, any other I/O port(s) and/or antennas/antenna array that are known now or may be developed in the future. Therefore, the network processor unit(s) and/or the network I/O interface(s) may include suitable interfaces for receiving, transmitting, and/or otherwise communicating data and/or information in a network environment.

I/O interfaces allow the input and output of data and/or information with other entities which may be connected to the computer. For example, the I/O interfaces may provide a connection to external devices such as a keyboard, numerical keypad, a touch screen, and/or any other suitable input and/or output device that is known now or may be developed in the future. In some instances, the external devices can also include (non-transitory) computer-readable storage media such as database systems, USB memories, portable optical or magnetic discs and memory cards. In still some instances, the external devices can be a mechanism for displaying data to a user, such as a computer monitor, a display screen, or the like.

FIG. 1 schematically show a first embodiment of the system of the invention, said system being applied on a high-voltage three-phase AC cable 1 having a first cable configuration.

The cable 1 according to the first configuration comprises one conductor R, S, T per phase and a shield $S_R$, $S_S$, $S_T$ associated with each conductor R, S, T and it extends between a first end 10 and a second end 11.

Furthermore, the cable 1 according to the first configuration has a single point connection system, the connection to ground G of the shields $S_R$, $S_S$, $S_T$ being performed at an intermediate point 12 by means of a grounding element, with the cable 1 being divided into two sections P1, P2. Furthermore, the shields $S_R$, $S_S$, $S_T$ are connected to a surge arrester device 3, 4 connected to ground G both at the first end 10 and at the second end 11 of the cable 1.

The cable 1 according to the first configuration also comprises an earth continuity conductor ECC connecting the ground connection 20 of the grounding element and the ground connections 30, 40 of the devices surge arrester 3, 4 establishing a common ground G of the system.

Figure 2:
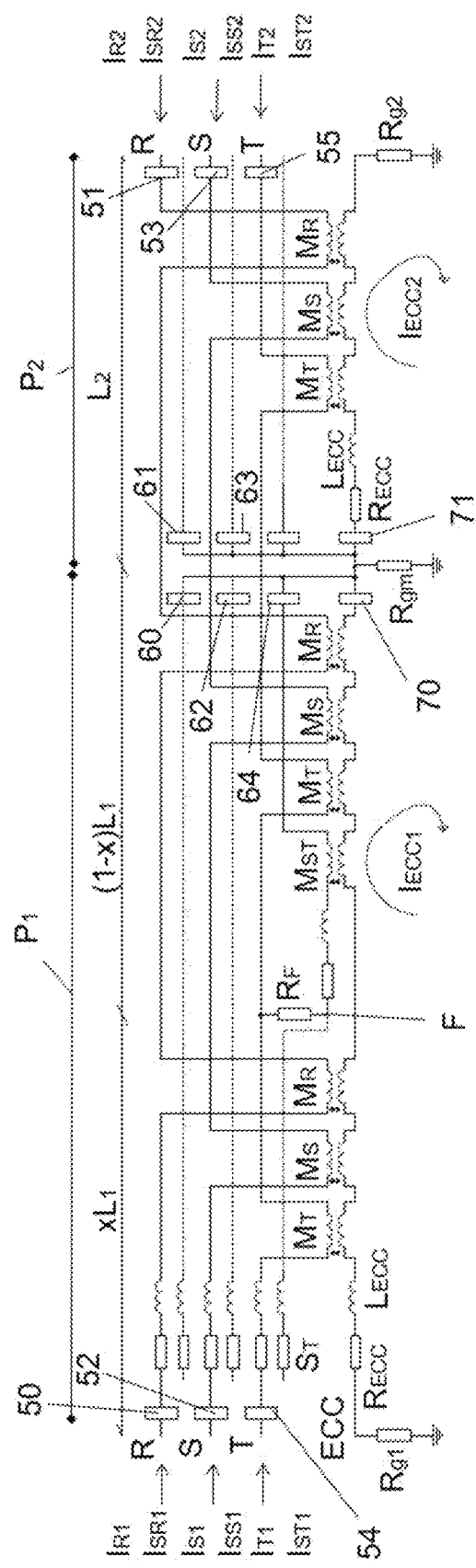
FIG. 2 shows the model of the cable of FIG. 1.

In the first embodiment, the system comprises a first current measuring equipment 5 configured for measuring the conductor current $I_{R1}$, $I_{S1}$, $I_{T1}$, $I_{R2}$, $I_{S2}$, $I_{T2}$ circulating through each conductor R, S, T both at the first end 10 and at the second end 11 of the cable 1. As shown in FIG. 2, the first current measuring equipment 5 comprises six current sensors 50, 51, 52, 53, 54, 55, with one current sensor 50, 51, 52, 53, 54, 55 being arranged at each end of each conductor R, S, T.

In the first embodiment, the system comprises a second current measuring equipment 6 configured for measuring the shield current $I_{SR1}$, $I_{SS1}$, $I_{ST1}$, $I_{SR2}$, $I_{SS2}$, $I_{ST2}$ of each shield $S_R$, $S_S$, $S_T$ in each section $P_1$, $P_2$ at a point close to the grounding element. As shown in FIG. 2, the second current measuring equipment 5 comprises six current sensors 60, 61, 62, 63, 64, 65, with one current sensor 60, 61, 62, 63, 64, 65 being arranged in each shield $S_R$, $S_S$, $S_T$ in each section $P_1$, $P_2$ at a point close to the grounding element.

Furthermore, in the first embodiment the system comprises a third current measuring equipment 7 configured for measuring the earth continuity conductor current $I_{ECC1}$, $I_{ECC2}$ of the earth continuity conductor ECC in each section $P_1$, $P_2$ at a point close to the grounding element. As shown in FIG. 2, the third current measuring equipment 7 comprises two current sensors 70, 71, with one of the current sensors 70 being arranged in section $P_1$ of the earth continuity conductor ECC at a point close to the grounding element, with the other current sensor 71 being arranged in section $P_2$ of the earth continuity conductor ECC at a point close to the grounding element.

The system of the invention comprises a computer, not shown in the figures, configured for executing the method of the invention based on the current measurements performed by said current measuring equipment 50, 51, 52, 53, 54, 55, 60, 61, 62, 63, 64, 65, 70, 71.

A fault between the conductor T and its shield $S_T$ in the first section $P_1$ has been depicted in FIG. 2. In order to locate said fault point F, the method of the invention would be applied as follows:

Measuring the conductor current $I_{R1}$, $I_{S1}$, $I_{T1}$, $I_{R2}$, $I_{S2}$, $I_{T2}$ circulating through each conductor R, S, T both at the first end 10 and at the second end 11 of the cable 1 by means of the first current measuring equipment 5.

Also, measuring the shield current $I_{SR1}$, $I_{SS1}$, $I_{ST1}$, $I_{SR2}$, $I_{SS2}$, $I_{ST2}$ circulating through each shield $S_R$, $S_S$, $S_T$ in each section $P_1$, $P_2$ at a point close to the grounding element by means of the second current measuring equipment 6. Also, measuring the earth continuity conductor current $I_{ECC}$ circulating through each section $P_1$, $P_2$ at a point close to the grounding element by means of the third current measuring equipment.

Comparing the conductor current $I_{R1}$; $I_{S1}$; $I_{T1}$ measured at the first end 10 of the cable 1 for each conductor R, S, T with the conductor current $I_{R2}$; $I_{S2}$; $I_{T2}$ measured at the second end 11 of the cable 1. In this case, the conductor current $I_{R1}$ of the conductor T at the first end 10 of the cable 1 will be different from the conductor current $I_{R2}$ at the first end 11, such that it will be determined that conductor T is the conductor which is in fault.

Also, analysing the shield currents $I_{SR1}$, $I_{SS1}$, $I_{ST1}$; $I_{SR2}$, $I_{SS2}$, $I_{ST2}$ of each section $P_1$, $P_2$. In this case, the shield current $I_{ST1}$ will be observed as having an overcurrent value, determining that section $P_1$ is the section which is in fault.

Figure 3:
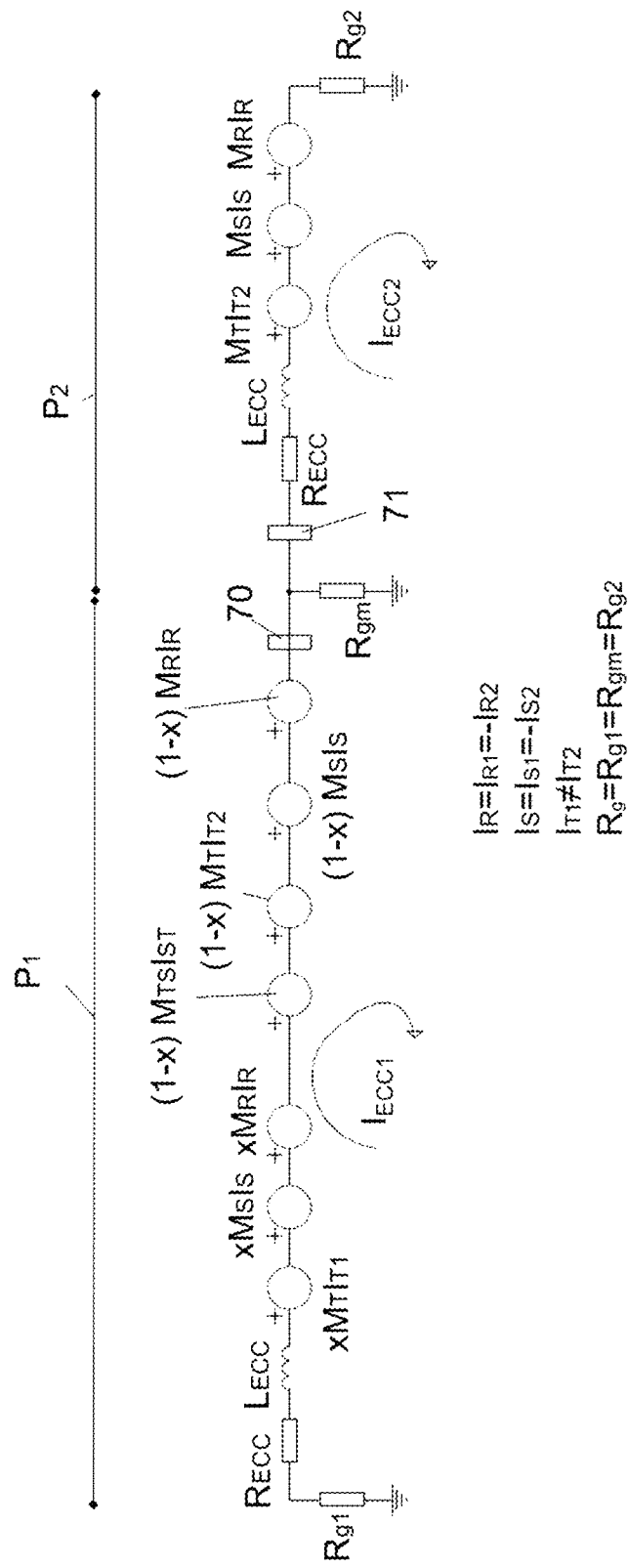
FIG. 3 shows the model of the earth continuity conductor of the cable of FIG. 1.

Once conductor T in fault and section $P_1$ in fault have been determined, defining the model of the earth conductor ECC shown in FIGS. 2 and 3.

The net representing section $P_2$ which is not in fault comprises the self-resistance $R_{ECC}$ and the self-inductance $L_{ECC}$ of the earth continuity conductor ECC, the ground resistance $R_{gm}$, $R_{g2}$ of the ground connections 20, 40 of the grounding element and the surge arrester device 4, and the mutual inductance $M_R$, $M_S$, $M_T$ between said earth continuity conductor ECC and each of the conductors R, S, T. Therefore, all the parameters of the net of section $P_2$ which is not in fault can be calculated by knowing the characteristics of the cable 1, the conductor currents $I_{R2}$, $I_{S2}$, $I_{T2}$ circulating through the conductor R, S, T at the second end 11 of the cable 1, and the earth continuity conductor currents ECC $I_{ECC1}$, $I_{ECC2}$ circulating through both sections $P_1$, $P_2$, the only unknown being the ground resistances $R_{gm}$, $R_{g2}$. All the ground resistances $R_g$, $R_{g2}$, $R_{gm}$, $R_{g2}$ of the model of the earth conductor ECC are considered equal.

Therefore, in this case ground resistance $R_g$ is calculated using the following formula:

$$0 = I_{ECC2}(R_{g2} + R_{gm} + R_{ECC} + jwL_{ECC}) - I_{ECC1}R_{gm} - jwI_{R2}M_R - jwI_{S2}M_S - jwI_{T2}M_T$$

wherein, $I_{ECC1}$=The current circulating through section $P_1$ which is in fault, $I_{ECC2}$=The current circulating through section $P_2$ which is not in fault, $R_{gm}$=The ground resistance of the grounding device 2, $R_{g2}$=The ground resistance of the surge arrester device 4 arranged at the second end 11 of the cable 1, $R_{ECC}$=The self-resistance of the earth continuity conductor ECC, calculated taking into account the characteristics of the cable 1, $L_{ECC}$=The self-inductance of the earth continuity conductor ECC, calculated taking into account the characteristics of the cable 1, $I_{R2}$=Current circulating through the conductor R which is not in fault at the second end 11 of the cable 1, $I_{S2}$=Current circulating through the conductor S which is not in fault at the second end 11 of the cable 1, $I_{T2}$=Current circulating through the conductor T which is in fault at the second end 11 of the cable 1, $M_R$=Mutual inductance between the conductor R and the earth continuity conductor ECC, calculated taking into account the characteristics of the cable 1, $M_S$=Mutual inductance between the conductor S and the earth continuity conductor ECC, calculated taking into account the characteristics of the cable 1, and $M_T$=Mutual inductance between the conductor T and the earth continuity conductor ECC, calculated taking into account the characteristics of the cable 1.

The net representing section $P_1$ in fault comprises the self-resistance $R_{ECC}$ and the self-inductance $L_{ECC}$ of the earth continuity conductor ECC, the ground resistance $R_g$ of the ground connection 20 of the grounding element and of the ground connection 30 of the surge arrester device 3, the mutual inductance $M_R$, $M_S$, $M_T$ between said earth continuity conductor ECC and each of the conductors R, S, T, and the mutual inductance $M_{ST}$ between said earth continuity conductor ECC and the shield $S_T$ in fault from the fault point F to the point where the shields are connected to ground G. Taking into account that the ground resistance $R_g$ is obtained from the net of section $P_2$ which is not in fault, all the parameters of the net of section $P_1$ in fault can be calculated by knowing the characteristics of the cable 1, the conductor currents $I_{R1}$, $I_{S1}$, $I_{T1}$ circulating through the conductor R, S, T at the first end 1 of the cable 1, the shield current $I_{ST1}$ circulating through the shield $S_T$ in fault in section $P_1$ in fault and the currents of earth continuity conductor ECC $I_{ECC1}$, $I_{ECC2}$ circulating through both sections $P_1$, $P_2$, the only unknown being the distance x to the fault point F.

Therefore, the location of the fault point is calculated using the following formula:

$$0 = I_{ECC1}(R_{g1} + R_{gm} + R_{ECC} + jwL_{ECC}) - I_{ECC2}R_{gm} + jwxI_RM_R + jwxI_SM_S + jwxI_{T1}M_T + jw(1-x)I_RM_R + jw(1-x)I_SM_S - jw(1-x)I_{T2}M_T + jw(1-x)I_{ST}M_{ST}$$

wherein, $I_{ECC1}$=The current circulating through section $P_1$ which is in fault, $I_{ECC2}$=The current circulating through section $P_2$ which is not in fault, $R_{g1}$=The ground resistance of the surge arrester device 3 arranged at the first end 10 of the cable 1, $R_{gm}$=The ground resistance of the grounding device 2, $R_{ECC}$=The self-resistance of the earth continuity conductor ECC, calculated taking into account the characteristics of the cable 1, $L_{ECC}$=The self-inductance of the earth continuity conductor ECC, calculated taking into account the characteristics of the cable 1, $I_R = I_{R1} = I_{R2}$=Current circulating through the conductor R which is not in fault, both at the first end 10 of the cable 1 and at the second end 11 of the cable 1, $I_S=I_{S1}=I_{S2}$=Current circulating through the conductor S which is not in fault, both at the first end 10 of the cable 1 and at the second end 11 of the cable 1, $I_{T1}$=Current circulating through the conductor T which is in fault at the first end 10 of the cable 1, $I_{T2}$=Current circulating through the conductor T which is in fault at the second end 11 of the cable 1, $$I_{T1} \neq I_{T2}$$

$I_{ST}$=Current circulating through the shield $S_T$ in fault in section $P_1$ in fault; if the current flows from the first end to the second end, it will be considered positive; in contrast, if it flows from the second end to the first end, it will be considered negative, $M_R$=Mutual inductance between the conductor R and the earth continuity conductor ECC, calculated taking into account the characteristics of the cable 1, $M_S$=Mutual inductance between the conductor S and the earth continuity conductor ECC, calculated taking into account the characteristics of the cable 1, $M_T$=Mutual inductance between the conductor T and the earth continuity conductor ECC, calculated taking into account the characteristics of the cable 1, $M_{ST}$=Mutual inductance between the shield $S_T$ in fault and the earth continuity conductor ECC, calculated taking into account the characteristics of the cable 1, and x=The distance to the fault point from the end of section $P_1$ in fault at which the surge arrester device is arranged to the fault point F.

Figure 4:
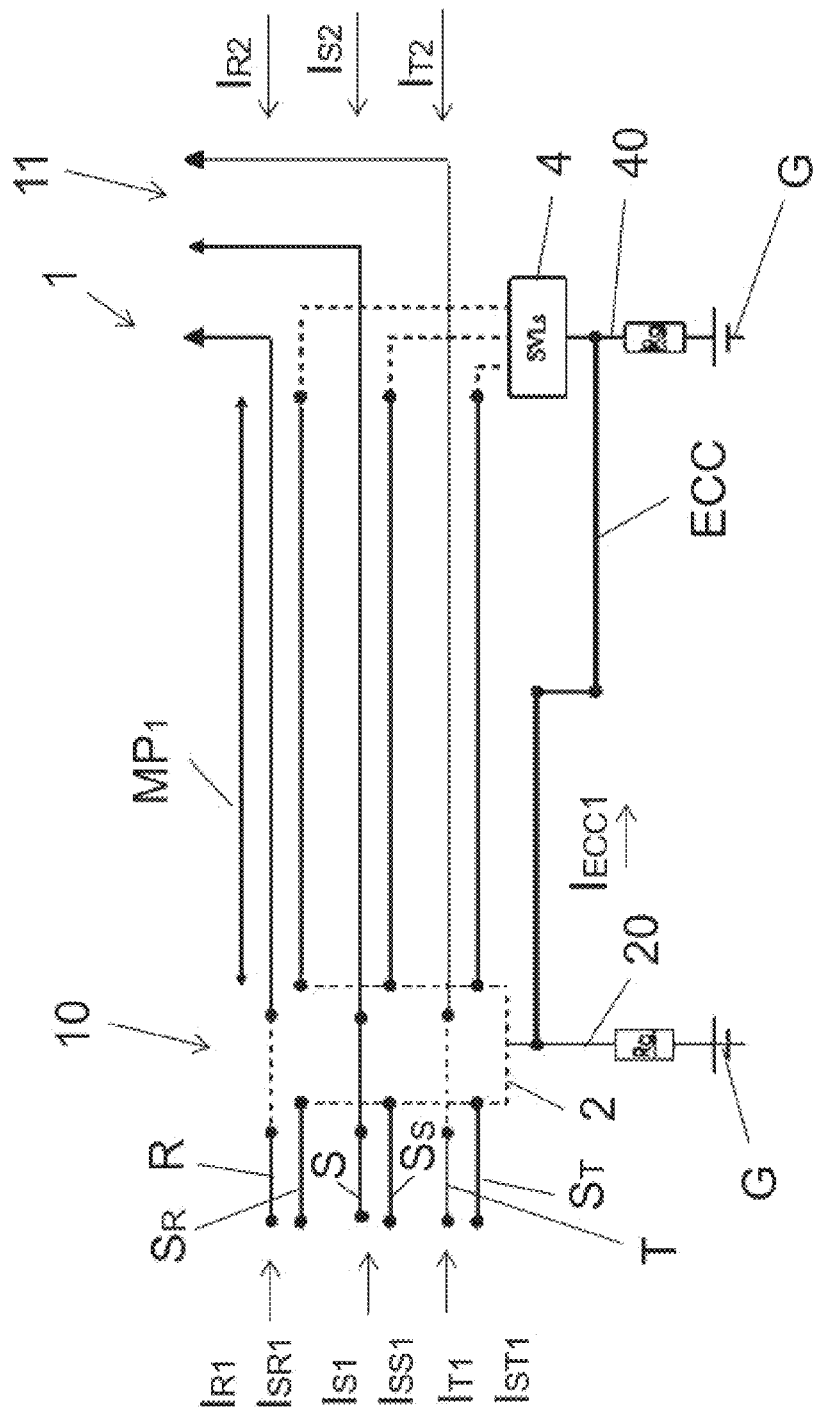
FIG. 4 schematically shows a system for locating a fault point on a cable according to a second embodiment of the invention applied on a cable having a second configuration.

FIG. 4 schematically shows a second embodiment of the system of the invention, said system being applied on a high-voltage three-phase AC cable 1 having a second cable configuration.

The cable 1 according to the first configuration comprises one conductor R, S, T per phase and a shield $S_R$, $S_S$, $S_T$ associated with each conductor R, S, T and extends between a first end 10 and a second end 11.

Furthermore, the cable 1 according to the first configuration has a single point connection system, the connection to ground G of the shields $S_R$, $S_S$, $S_T$ being performed at the first end 10 of the cable 1, with shields $S_R$, $S_S$, $S_T$ being connected to a surge arrester device 4 connected to ground G at the second end 11 of the cable 1. The cable 1 thereby comprises a single section $P_1$.

The cable 1 according to the first configuration also comprises an earth continuity conductor ECC connecting the ground connection 20 of the grounding element and the connection 40 of the surge arrester device 4 establishing a common ground G of the system.

In the second embodiment, the system comprises a first current measuring equipment 5 configured for measuring the conductor current $I_{R1}$, $I_{S1}$, $I_{T1}$, $I_{R2}$, $I_{S2}$, $I_{T2}$ circulating through each conductor R, S, T both at the first end 10 and at the second end 11 of the cable 1. The first current measuring equipment 5 comprises six current sensors 50, 51, 52, 53, 54, 55, with one current sensor 50, 51, 52, 53, 54, 55 being arranged at each end of each conductor R, S, T.

In the second embodiment, the system comprises a second current measuring equipment 6 configured for measuring the shield current $I_{SR1}$, $I_{SS1}$, $I_{ST1}$ of each shield $S_R$, $S_S$, $S_T$ at a point close to the grounding element 2. The second current measuring equipment 5 comprises three current sensors 60, 61, 62, with one current sensor 60, 61, 62 being arranged in each shield $S_R$, $S_S$, $S_T$ at a point close to the grounding element 2.

Furthermore, in the second embodiment the system comprises a third current measuring equipment 7 configured for measuring the earth continuity conductor current $I_{ECC1}$ of the earth continuity conductor ECC at a point close to the grounding element 2. The third current measuring equipment 7 comprises a single current sensor 70 arranged at a point close to the grounding element 2.

The system of the invention comprises a computer, not shown in the figures, configured for executing the method of the invention based on the current measurements performed by said current measuring equipment 50, 51, 52, 53, 54, 55, 60, 61, 62, 70.

The method of the invention would be applied in a manner similar to that explained for the first embodiment, with the main difference being the obligation to estimate the value of the ground resistance $R_g$ since the cable 1 of the second embodiment comprises a single section $P_1$, and therefore, the model of the earth conductor ECC will comprise a single net.

The clauses that follow disclose additional embodiments or combinations of embodiments:

Clause 1. A method for locating a fault point (F) on a high-voltage three-phase AC cable (1) comprising a first end (10), a second end (11), and at least one section ($P_1$, $P_2$) extending between said ends (10, 11), the cable (1) comprising a conductor (R, S, T) and a respective shield ($S_R$, $S_S$, $S_T$) per phase, shields ($S_R$, $S_S$, $S_T$) being connected to a surge arrester device (3, 4) connected to ground (G) at one end of said at least one section ($P_1$, $P_2$), and shields ($S_R$, $S_S$, $S_T$) being connected to a grounding element (2) at the other end of said at least one section (P1, P2), the cable (1) comprising an earth continuity conductor (ECC) establishing a common ground (G) connecting the ground connections (20, 30, 40) of the grounding element(s) and the surge arrester device(s) (3, 4), the method comprising the following steps:

measuring the conductor current ($I_{R1}$, $I_{S1}$, $I_{T1}$, $I_{R2}$, $I_{S2}$, $I_{T2}$) circulating through each conductor (R, S, T) both at the first end (10) and at the second end (11) of the cable (1), measuring the shield current ($I_{SR1}$, $I_{SS1}$, $I_{ST1}$, $I_{SR2}$, $I_{SS2}$, $I_{ST2}$) circulating through each shield ($S_R$, $S_S$, $S_T$) in each section ($P_1$, $P_2$) at a point close to the grounding element, measuring the earth continuity conductor current ($I_{ECC1}$, $I_{ECC2}$) circulating through each section ($P_1$, $P_2$) at a point close to the grounding element, determining the conductor (R, S, T) in fault based on the previously measured conductor currents ($I_{R1}$, $I_{S1}$, $I_{T1}$, $I_{R2}$, $I_{S2}$, $I_{T2}$), in the event that the cable (1) comprises more than one section ($P_1$, $P_2$), determining section ($P_1$, $P_2$) in fault based on the previously measured shield currents ($I_{SR1}$, $I_{SS1}$, $I_{ST1}$, $I_{SR2}$, $I_{SS2}$, $I_{ST2}$), and locating the fault point (F) by means of a model of section ($P_1$, $P_2$) in fault of the earth continuity conductor (ECC), the only unknown being the distance (x) to the fault point (F) from an end of said section ($P_1$, $P_2$) in fault.

Clause 2. The method according to clause 1, wherein for determining the conductor (R, S, T) in fault, the conductor current ($I_{R1}$; $I_{S1}$; $I_{T1}$) measured at the first end (10) of the cable (1) for each conductor (R, S, T) is compared with the conductor current ($I_{R2}$; $I_{S2}$; $I_{T2}$) measured at the second end (11) of the cable (1), determining that the conductor (R, S, T) in fault will be the conductor in which the conductor current ($I_{R1}$, $I_{R2}$; $I_{S1}$, $I_{S2}$; $I_{T1}$, $I_{T2}$) at said ends (10, 11) is different.

Clause 3. The method according to clause 1 or 2, wherein the cable (1) comprises at least two sections ($P_1$, $P_2$), section ($P_1$, $P_2$) in fault being determined taking into account that in said section in fault ($P_1$, $P_2$), one of the shield currents ($I_{SR1}$, $I_{SS1}$, $I_{ST1}$; $I_{SR2}$, $I_{SS2}$, $I_{ST2}$) will have an overcurrent value.

Clause 4. The method according to any of clauses 1 to 3, wherein the model of the earth continuity conductor (ECC) of section ($P_1$, $P_2$) in fault takes into account the self-resistance ($R_{ECC}$) and the self-inductance ($L_{ECC}$) of the earth continuity conductor (ECC), the ground resistance ($R_g$) of the ground connections (20, 30, 40) of the grounding elements and/or the surge arrester device(s) (3, 4), the mutual inductance ($M_R$, $M_S$, $M_T$) between said earth continuity conductor (ECC) and each of the conductors (R, S, T), and the mutual inductance ($M_{SR}$, $M_{SS}$, $M_{ST}$) between said earth continuity conductor (ECC) and the shield in fault ($S_R$, $S_S$, $S_T$) from the fault point (F) to the point where the shields are connected to ground (G).

Clause 5. The method according to claim 4, wherein the location of the fault point is calculated using the following formula:

$$0 = I_{ECCF}(R_g + R_g + R_{ECC} + jwL_{ECC}) - I_{ECCNFL}R_g - I_{ECCNFR}R_g + jwxI_{CNF1}M_{CNF1} + jwxI_{CNF2}M_{CNF2} + jwxI_{CF1}M_{CF} + jw(1-x)I_{CNF1}M_{CNF1} + jw(1-x)I_{CNF2}M_{CNF2} - jw(1-x)I_{CF2}M_{CF} + jw(1-x)I_{SF}M_{SF}$$

wherein, $I_{ECCF}$=The current circulating through the section of the earth continuity conductor (ECC) which is in fault, $I_{ECCNFL}$=The current circulating through the section of the earth continuity conductor (ECC) to the left of the section in fault; in the event that there is no section to the left of the section in fault its value will be zero, $I_{ECCNFR}$=The current circulating through the section of the earth continuity conductor (ECC) to the right of the section in fault; in the event that there is no section to the right of the section in fault its value will be zero, $R_g$=The ground resistance of the grounding of the shields or of the grounding of the surge arrester device, $R_{ECC}$=The self-resistance of the earth continuity conductor (ECC) of the section in fault, calculated taking into account the characteristics of the cable (1), $L_{ECC}$=The self-inductance of the earth continuity conductor (ECC) of the section in fault, calculated taking into account the characteristics of the cable (1), $I_{CNF1}$=Current circulating through a first conductor which is not in fault, both at the first end (10) of the cable (1) and at the second end (11) of the cable (1), $I_{CNF2}$=Current circulating through a second conductor which is not in fault, both at the first end (10) of the cable (1) and at the second end (11) of the cable (1), $I_{CF1}$=Current circulating through the conductor in fault at the first end (10) of the cable (1), $I_{CF2}$=Current circulating through the conductor in fault at the second end (11) of the cable (1), $I_{CF1} \neq I_{CF2}$ $I_{SF}$=Current circulating through the shield in fault in the section in fault; if the current flows from the first end to the second end, it will be considered positive; in contrast, if it flows from the second end to the first end, it will be considered negative, $M_{CNF1}$=Mutual inductance between the first conductor which is not in fault and the earth continuity conductor (ECC), calculated taking into account the characteristics of the cable (1), $M_{CNF2}$=Mutual inductance between the second conductor which is not in fault and the earth continuity conductor (ECC), calculated taking into account the characteristics of the cable (1), $M_{CF}$=Mutual inductance between the conductor which is in fault and the earth continuity conductor (ECC), calculated taking into account the characteristics of the cable (1), $M_{SF}$=Mutual inductance between the shield which is in fault and the earth continuity conductor (ECC), calculated taking into account the characteristics of the cable (1), and x=The distance to the fault point from the end of the section in fault at which the surge arrester device is arranged to the fault point (F).

Clause 6. The method according to clause 4 or 5, wherein when the cable (1) comprises more than one section ($P_1$, $P_2$), the ground resistance ($R_g$) of the ground connections (20, 30, 40) of the grounding elements and/or the surge arrester device(s) (3, 4) is determined by means of a model of the earth continuity conductor (ECC) of one of the sections ($P_1$, $P_2$) which is not in fault, said model comprising the self-resistance ($R_{ECC}$) and the self-inductance ($L_{ECC}$) of the earth continuity conductor (ECC), the ground resistance ($R_g$) of the ground connections (20, 30, 40) of the grounding elements and/or the surge arrester device(s) (3, 4), the mutual inductance ($M_R$, $M_S$, $M_T$) between said earth continuity conductor (ECC) and each of the conductors (R, S, T), the only unknown being said ground resistance ($R_g$).

Clause 7. The method according to claim 6, wherein the ground resistance ($R_g$) is calculated using the following formula:

$$0 = I_{ECCNF}(R_g + R_g + R_{ECC} + jwL_{ECC}) - I_{ECCL}R_g - I_{ECCR}R_g + jwI_{CNF1}M_{CNF1} + jwI_{CNF2}M_{CNF2} + jwI_{CF}M_{CF}$$

wherein, $I_{ECCNF}$=The current circulating through the section which is not in fault the model of which is used to calculate ground resistance ($R_g$), $I_{ECCL}$=The current circulating through the section to the left of the section which is not in fault; in the event that there is no section to the left of the section which is not in fault, its value will be zero, $I_{ECCR}$=The current circulating through the section to the right of the section which is not in fault; in the event that there is no section to the right of the section which is not in fault, its value will be zero, $R_g$=The ground resistance of the grounding of the shields or of the grounding of the surge arrester device at one of the ends of the section in fault, $R_{ECC}$=The self-resistance of the earth continuity conductor (ECC) of the section in fault, calculated taking into account the characteristics of the cable (1), $L_{ECC}$=The self-inductance of the earth continuity conductor (ECC) of the section in fault, calculated taking into account the characteristics of the cable (1), $I_{CNF1}$=Current circulating through a first conductor which is not in fault at the first end (10) of the cable (1), $I_{CNF2}$=Current circulating through a second conductor which is not in fault at the first end (10) of the cable (1), $I_{CF}$=Current circulating through the conductor in fault; if the current flows from the first end to the second end, it will be considered positive; in contrast, if it flows from the second end to the first end, it will be considered negative, $M_{CNF1}$=Mutual inductance between the first conductor which is not in fault and the earth continuity conductor (ECC), calculated taking into account the characteristics of the cable (1), $M_{CNF2}$=Mutual inductance between the second conductor which is not in fault and the earth continuity conductor (ECC), calculated taking into account the characteristics of the cable (1), and $M_{CF}$=Mutual inductance between the conductor which is in fault and the earth continuity conductor (ECC), calculated taking into account the characteristics of the cable 1.

Clause 8. The method according to clause 4 or 5, wherein when the cable (1) comprises a single section ($P_1$) the ground resistance ($R_g$) of the ground connections (20, 30) of the grounding element and the surge arrester device (3) is estimated.

Clause 9. A system for locating a fault point (F) on a high-voltage three-phase AC cable (1) comprising a first end (10) and a second end (11) and at least one section ($P_1$, $P_2$) extending between said ends (10, 11), the cable (1) comprising a conductor (R, S, T) and a respective shield ($S_R$, $S_S$, $S_T$) per phase, shields ($S_R$, $S_S$, $S_T$) being connected to a surge arrester device (3, 4) connected to ground (G) at one end of said at least one section ($P_1$, $P_2$) and shields ($S_R$, $S_S$, $S_T$) being connected to a grounding element at the other end of said at least one section (P1, P2), the cable (1) comprising an earth continuity conductor (ECC) establishing a common ground (G) connecting the ground connections (20, 30, 40) of the grounding element(s) (2) and the surge arrester device(s) (3, 4), the system comprising:
a first current measuring equipment (5) configured for measuring the conductor current ($I_{R1}$, $I_{S1}$, $I_{T1}$, $I_{R2}$, $I_{S2}$, $I_{T2}$) circulating through each conductor (R, S, T) both at the first end (10) and at the second end (11) of the cable (1), a second current measuring equipment (6) configured for measuring the shield current ($I_{SR1}$, $I_{SS1}$, $I_{ST1}$, $I_{SR2}$, $I_{SS2}$, $I_{ST2}$,) of each shield ($S_R$, $S_S$, $S_T$) in each section ($P_1$, $P_2$) at a point close to the grounding element, a third current measuring equipment (7) configured for measuring the earth continuity conductor current ($I_{ECC1}$, $I_{ECC2}$) of the earth continuity conductor (ECC) in each section ($P_1$, $P_2$) at a point close to the grounding element (2), and a computer configured for executing the method according to any of clauses 1 to 8 based on the current measurements performed by said current measuring equipment (5, 6, 7).

What is claimed is:

1. A method for locating a fault point (F) on a high-voltage three-phase AC cable (1) comprising a first end (10), a second end (11), and at least one section ($P_1$, $P_2$) extending between the first and second ends (10, 11), the cable (1) comprising first, second and third conductors (R, S, T) and respective first, second and third shields ($S_R$, $S_S$, $S_T$), the first, second and third shields ($S_R$, $S_S$, $S_T$) being connected to a surge arrester device (3,4) connected to ground (G) at one end of the at least one section ($P_1$, $P_2$), the first, second and third shields ($S_R$, $S_S$, $S_T$) being connected to a grounding element (2) at the other end of said at least one section (P1, P2), the grounding element (2) being connected to the ground (G) through a ground connection (20), the surge arrester device (3,4) being connected to the ground (G) through a ground connection (30,40), the cable (1) comprising an earth continuity conductor (ECC) connecting the ground connections (20, 30, 40), the method comprising:

measuring a conductor current ($I_{R1}$, $I_{S1}$, $I_{T1}$, $I_{R2}$, $I_{S2}$, $I_{T2}$) circulating through each of the first, second and third conductors (R, S, T) both at the first end (10) and at the second end (11) of the cable (1);

measuring a shield current ($I_{SR1}$, $I_{SS1}$, $I_{ST1}$, $I_{SR2}$, $I_{SS2}$, $I_{ST2}$) circulating through each of the first, second and third shields ($S_R$, $S_S$, $S_T$) in each section ($P_1$, $P_2$) at a first point close to the grounding element;

measuring an earth continuity conductor current ($I_{ECC1}$, $I_{ECC2}$) circulating through each section ($P_1$, $P_2$) at the first point close to the grounding element or at a second point close to the grounding element;

determining a fault in one of the first, second and third conductor (R, S, T) based on the previously measured conductor currents ($I_{R1}$, $I_{S1}$, $I_{T1}$, $I_{R2}$, $I_{S2}$, $I_{T2}$);

in the event that the cable (1) comprises more than one section ($P_1$, $P_2$), determining section ($P_1$, $P_2$) in fault based on the previously measured shield currents ($I_{SR1}$, $I_{SS1}$, $I_{ST1}$, $I_{SR2}$, $I_{SS2}$, $I_{ST2}$); and locating a fault point (F) by means of a model of section ($P_1$, $P_2$) in fault of the earth continuity conductor (ECC), the only unknown being the distance (x) to the fault point (F) from an end of said section ($P_1$, $P_2$) in fault.

2. The method according to claim 1, wherein for determining a fault in one of the first, second and third conductor (R, S, T), the conductor current ($I_{R1}$; $I_{S1}$; $I_{T1}$) measured at the first end (10) of the cable (1) for each of the first, second and third conductors (R, S, T) is compared with the conductor current ($I_{R2}$; $I_{S2}$; $I_{T2}$) measured at the second end (11) of the cable (1), determining that the one of the first, second and third conductor (R, S, T) in fault being the one of the first, second and third conductor in which the conductor current ($I_{R1}$, $I_{R2}$; $I_{S1}$, $I_{S2}$; $I_{T1}$, $I_{T2}$) at the ends (10, 11) is different.

3. The method according to claim 1, wherein the cable (1) comprises at least two sections ($P_1$, $P_2$), section ($P_1$, $P_2$) in fault being determined taking into account that in said section in fault ($P_1$, $P_2$), one of the shield currents ($I_{SR1}$, $I_{SS1}$, $I_{ST1}$; $I_{SR2}$, $I_{SS2}$, $I_{ST2}$) will have an overcurrent value.

4. The method according to claim 1, wherein the model of the earth continuity conductor (ECC) of section ($P_1$, $P_2$) in fault takes into account the self-resistance ($R_{ECC}$) and the self-inductance ($L_{ECC}$) of the earth continuity conductor (ECC), the ground resistance ($R_g$) of the first, second and third ground connections (20, 30, 40), the mutual inductance ($M_R$, $M_S$, $M_T$) between said earth continuity conductor (ECC) and each of the first, second and third conductors (R, S, T), and the mutual inductance ($M_{SR}$, $M_{SS}$, $M_{ST}$) between said earth continuity conductor (ECC) and the shield in fault ($S_R$, $S_S$, $S_T$) from the fault point (F) to the point where the shields are connected to ground (G).

5. The method according to claim 4, wherein the location of the fault point is calculated using the following formula:

$$0 = I_{ECCF}(R_g + R_g + R_{ECC} + jWL_{ECC}) - I_{ECCNFL}R_g - I_{ECCNFR}R_g + jwxI_{CNF1}M_{CNF1} + jwxI_{CNF2}M_{CNF2} + jwxI_{CF1}M_{CF} + jw(1-x)I_{CNF1}M_{CNF1} + jw(1-x)I_{CNF2}M_{CNF2} - jw(1-x)I_{CF2}M_{CF} + jw(1-x)I_{SF}M_{SF}$$

wherein, $I_{ECCF}$=the current circulating through the section of the earth continuity conductor (ECC) which is in fault, $I_{ECCNFL}$=the current circulating through the section of the earth continuity conductor (ECC) to the left of the section in fault; in the event that there is no section to the left of the section in fault its value will be zero, $I_{ECCNFR}$=the current circulating through the section of the earth continuity conductor (ECC) to the right of the section in fault; in the event that there is no section to the right of the section in fault its value will be zero, $R_g$=the ground resistance of the grounding of the shields or of the grounding of the surge arrester device, $R_{ECC}$=the self-resistance of the earth continuity conductor (ECC) of the section in fault, calculated taking into account the characteristics of the cable (1), $L_{ECC}$=the self-inductance of the earth continuity conductor (ECC) of the section in fault, calculated taking into account the characteristics of the cable (1), $I_{CNF1}$=current circulating through a first conductor which is not in fault, both at the first end (10) of the cable (1) and at the second end (11) of the cable (1), $I_{CNF2}$=current circulating through a second conductor which is not in fault, both at the first end (10) of the cable (1) and at the second end (11) of the cable (1), $I_{CF1}$=current circulating through the conductor in fault at the first end (10) of the cable (1), $I_{CF2}$=current circulating through the conductor in fault at the second end (11) of the cable (1), $$I_{CF1} \neq I_{CF2}$$

$I_{SF}$=current circulating through the shield in fault in the section in fault; if the current flows from the first end to the second end, it will be considered positive; in contrast, if it flows from the second end to the first end, it will be considered negative, $M_{CNF1}$=mutual inductance between the first conductor which is not in fault and the earth continuity conductor (ECC), calculated taking into account the characteristics of the cable (1), $M_{CNF2}$=mutual inductance between the second conductor which is not in fault and the earth continuity conductor (ECC), calculated taking into account the characteristics of the cable (1), $M_{CF}$=mutual inductance between the conductor which is in fault and the earth continuity conductor (ECC), calculated taking into account the characteristics of the cable (1), $M_{SF}$=mutual inductance between the shield which is in fault and the earth continuity conductor (ECC), calculated taking into account the characteristics of the cable (1), and x=the distance to the fault point from the end of the section in fault at which the surge arrester device is arranged to the fault point (F).

6. The method according to claim 5, wherein when the cable (1) comprises more than one section ($P_1$, $P_2$), the ground resistance ($R_g$) of the ground connections (20, 30, 40) is determined by means of a model of the earth continuity conductor (ECC) of one of the sections ($P_1$, $P_2$) which is not in fault, said model comprising the self-resistance ($R_{ECC}$) and the self-inductance ($L_{ECC}$) of the earth continuity conductor (ECC), the ground resistance ($R_g$) of the ground connections (20, 30, 40), the mutual inductance ($M_R$, $M_S$, $M_T$) between said earth continuity conductor (ECC) and each of the first, second and third conductors (R, S, T), the only unknown being said ground resistance ($R_g$).

7. The method according to claim 6, wherein the ground resistance (Rg) is calculated using the following formula:

$$0 = I_{ECCNF}(R_g + R_g + R_{ECC} + jwL_{ECC}) - I_{ECCL}R_g - I_{ECCR}R_g + jwI_{CNF1}M_{CNF1} + jWI_{CNF2}M_{CNF2} + jwI_{CF}M_{CF}$$

wherein, $I_{ECCNF}$=the current circulating through the section which is not in fault the model of which is used to calculate ground resistance (Rg), $I_{ECCL}$=the current circulating through the section to the left of the section which is not in fault; in the event that there is no section to the left of the section which is not in fault, its value will be zero, $I_{ECCR}$=the current circulating through the section to the right of the section which is not in fault; in the event that there is no section to the right of the section which is not in fault, its value will be zero, $R_g$=the ground resistance of the grounding of the shields or of the grounding of the surge arrester device at one of the ends of the section in fault, $R_{ECC}$=the self-resistance of the earth continuity conductor (ECC) of the section in fault, calculated taking into account the characteristics of the cable (1), $L_{ECC}$=the self-inductance of the earth continuity conductor (ECC) of the section in fault, calculated taking into account the characteristics of the cable (1), $I_{CNF1}$=current circulating through a first conductor which is not in fault at the first end (10) of the cable (1), $I_{CNF2}$=current circulating through a second conductor which is not in fault at the first end (10) of the cable (1), $I_{CF}$=current circulating through the conductor in fault; if the current flows from the first end to the second end, it will be considered positive; in contrast, if it flows from the second end to the first end, it will be considered negative, $M_{CNF1}$=mutual inductance between the first conductor which is not in fault and the earth continuity conductor (ECC), calculated taking into account the characteristics of the cable (1), $M_{CNF2}$=mutual inductance between the second conductor which is not in fault and the earth continuity conductor (ECC), calculated taking into account the characteristics of the cable (1), and $M_{CF}$=mutual inductance between the conductor which is in fault and the earth continuity conductor (ECC), calculated taking into account the characteristics of the cable 1.

8. The method according to claim 5, wherein when the cable (1) comprises a single section ($P_1$) the ground resistance ($R_g$) of the ground connections (20, 30) of the grounding element and the surge arrester device (3) is estimated.

9. The method according to claim 4, wherein when the cable (1) comprises more than one section ($P_1$, $P_2$), the ground resistance ($R_g$) of the ground connections (20, 30, 40) is determined by means of a model of the earth continuity conductor (ECC) of one of the sections ($P_1$, $P_2$) which is not in fault, said model comprising the self-resistance ($R_{ECC}$) and the self-inductance ($L_{ECC}$) of the earth continuity conductor (ECC), the ground resistance ($R_g$) of the ground connections (20, 30, 40), the mutual inductance ($M_R$, $M_S$, $M_T$) between said earth continuity conductor (ECC) and each of the first, second and third conductors (R, S, T), the only unknown being said ground resistance ($R_g$).

10. The method according to claim 9, wherein the ground resistance (Rg) is calculated using the following formula:

$$0 = I_{ECCNF}(R_g + R_g + R_{ECC} + jWL_{ECC}) - I_{ECCL}R_g - I_{ECCR}R_g + jwI_{CNF1}M_{CNF1} + jwI_{CNF2}M_{CNF2} + jwI_{CF}M_{CF}$$

wherein, $I_{ECCNF}$=the current circulating through the section which is not in fault the model of which is used to calculate ground resistance (Rg), $I_{ECCL}$=the current circulating through the section to the left of the section which is not in fault; in the event that there is no section to the left of the section which is not in fault, its value will be zero, $I_{ECCR}$=the current circulating through the section to the right of the section which is not in fault; in the event that there is no section to the right of the section which is not in fault, its value will be zero, $R_g$=the ground resistance of the grounding of the shields or of the grounding of the surge arrester device at one of the ends of the section in fault, $R_{ECC}$=the self-resistance of the earth continuity conductor (ECC) of the section in fault, calculated taking into account the characteristics of the cable (1), $L_{ECC}$=the self-inductance of the earth continuity conductor (ECC) of the section in fault, calculated taking into account the characteristics of the cable (1), $I_{CNF1}$=current circulating through a first conductor which is not in fault at the first end (10) of the cable (1), $I_{CNF2}$=current circulating through a second conductor which is not in fault at the first end (10) of the cable (1), $I_{CF}$=current circulating through the conductor in fault; if the current flows from the first end to the second end, it will be considered positive; in contrast, if it flows from the second end to the first end, it will be considered negative, $M_{CNF1}$=mutual inductance between the first conductor which is not in fault and the earth continuity conductor (ECC), calculated taking into account the characteristics of the cable (1), $M_{CNF2}$=mutual inductance between the second conductor which is not in fault and the earth continuity conductor (ECC), calculated taking into account the characteristics of the cable (1), and $M_{CF}$=mutual inductance between the conductor which is in fault and the earth continuity conductor (ECC), calculated taking into account the characteristics of the cable 1.

11. The method according to claim 4, wherein when the cable (1) comprises a single section ($P_1$) the ground resistance ($R_g$) of the ground connections (20, 30) of the grounding element and the surge arrester device (3) is estimated.

12. A system for locating a fault point (F) on a high-voltage three-phase AC cable (1) comprising a first end (10) and a second end (11) and at least one section ($P_1$, $P_2$) extending between said ends (10, 11), the cable (1) comprising first, second and third conductor (R, S, T) and respective first, second and third shield ($S_R$, $S_S$, $S_T$), the first, second and third shields ($S_R$, $S_S$, $S_T$) being connected to a surge arrester device (3, 4) connected to ground (G) at one end of said at least one section ($P_1$, $P_2$) and the first, second and third shields ($S_R$, $S_S$, $S_T$) being connected to a grounding element (2) at the other end of said at least one section (P1, P2), the grounding element (2) being connected to the ground (G) through a ground connection (20), the surge arrester device (3,4) being connected to the ground (G) through a ground connection (30,40), the cable (1) comprising an earth continuity conductor (ECC) connecting the ground connections (20, 30, 40), the system comprising:

first current measuring equipment (5) configured for measuring the conductor current ($I_{R1}$, $I_{S1}$, $I_{T1}$, $I_{R2}$, $I_{S2}$, $I_{T2}$) circulating through each of the first, second and third conductors (R, S, T) both at the first end (10) and at the second end (11) of the cable (1);

second current measuring equipment (6) configured for measuring the shield current ($I_{SR1}$, $I_{SS1}$, $I_{ST1}$, $I_{SR2}$, $I_{SS2}$, $I_{ST2}$,) of each of the first, second and third shields ($S_R$, $S_S$, $S_T$) in each section ($P_1$, $P_2$) at a first point close to the grounding element;

third current measuring equipment (7) configured for measuring the earth continuity conductor current ($I_{ECC1}$, $I_{ECC2}$) of the earth continuity conductor (ECC) in each section ($P_1$, $P_2$) at the first point close to the grounding element (2) or at a second point close to the grounding element; and a computer configured for executing the method according to claim 1 based on the current measurements performed by said first, second and third current measuring equipment (5, 6, 7).

* * * * *